(12) United States Patent
Togasaki et al.

(10) Patent No.: US 8,674,587 B2
(45) Date of Patent: Mar. 18, 2014

(54) ULTRASONIC TRANSDUCER AND FABRICATING THE SAME

(75) Inventors: Takashi Togasaki, Kanagawa-ken (JP);
Takeshi Miyagi, Kanagawa-ken (JP);
Satoru Asagiri, Kanagawa-ken (JP);
Michiko Ooishi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 335 days.

(21) Appl. No.: 13/167,276

(22) Filed: Jun. 23, 2011

(65) Prior Publication Data

US 2011/0316387 A1   Dec. 29, 2011

(30) Foreign Application Priority Data

Jun. 23, 2010 (JP) ................... 2010-143167
Jun. 21, 2011 (JP) ................... 2011-137705

(51) Int. Cl.
*H04R 31/00* (2006.01)

(52) U.S. Cl.
USPC ............ 310/334; 310/326; 310/327; 310/335

(58) Field of Classification Search
USPC .................. 310/326, 327, 334, 335
See application file for complete search history.

(56) References Cited

U.S. PATENT DOCUMENTS

| | | | | |
|---|---|---|---|---|
| 4,385,255 | A * | 5/1983 | Yamaguchi et al. | 310/335 |
| 6,551,248 | B2 * | 4/2003 | Miller | 600/459 |
| 7,694,406 | B2 * | 4/2010 | Wildes et al. | 29/594 |
| 7,781,938 | B2 * | 8/2010 | Sugiura et al. | 310/334 |
| 7,830,069 | B2 * | 11/2010 | Lukacs et al. | 310/334 |
| 2008/0098816 | A1 * | 5/2008 | Yamashita et al. | 73/596 |
| 2008/0303381 | A1 * | 12/2008 | Yuuya et al. | 310/327 |
| 2012/0245470 | A1 * | 9/2012 | Ooishi et al. | 600/459 |

* cited by examiner

*Primary Examiner* — Derek Rosenau
*Assistant Examiner* — Bryan Gordon
(74) *Attorney, Agent, or Firm* — Oblon, Spivak, McClelland, Maier & Neustadt, L.L.P.

(57) ABSTRACT

An aspect of one embodiment, there is provided an ultrasonic transducer including a plurality of oscillators, each of the oscillator having a convex portion, a printed wiring board provided to be opposed to the convex portion, an adhesive material including at least a portion of the convex portion, the adhesive material joining the oscillator and the printed wiring board, and a resin provided between the oscillator and the printed wiring board, the resin covering the convex portion and the adhesive material.

8 Claims, 7 Drawing Sheets

ULTRASONIC TRANSDUCER AND FABRICATING THE SAME

CROSS REFERENCE TO RELATED APPLICATION

This application is based upon and claims the benefit of priority from prior Japanese Patent Application No. 2010-143167, filed on Jun. 23, 2010 and Japanese Patent Application No. 2011-137705, filed on Jun. 21, 2011, the entire contents of which are incorporated herein by reference.

FIELD

Exemplary embodiments described herein generally relate to an ultrasonic transducer and a method of fabricating the ultrasonic transducer.

BACKGROUND

An ultrasonic transducer, for example, has been used as an ultrasonic probe of an ultrasonograph. The ultrasonic transducer in the ultrasonograph carries ultrasonic waves to an object under test and receives reflection waves from the object under test. Recently, an ultrasonic transducer with higher accuracy inspection has been utilized. In this ultrasonic transducer, piezoelectric elements are arranged in a two-dimension array.

As shown in FIG. 9, in an ultrasonic transducer 101, for example, a conductive element 111 and an adhesive material 112 are provided between an oscillator 105 and an IC substrate 108 to connect the oscillator 105 and the IC substrate 108.

The oscillator 105 includes a plurality of transducer elements 102, a first electrode 103 and a second electrode 104. The transducer elements 102 are arranged in a prescribed matrix. The first electrode 103 and the second electrode 104 are arranged on two surfaces opposed each ether of the transducer element 102, respectively. Further, in the IC substrate 108, an integrated circuit 107 is provided on a substrate body 106, and a redistribution layer 110 including a conductive body 109 is provided on the integrated circuit 107.

A method of fabricating the ultrasonic transducer 101 is described below.

After the conductive element 111 is provided on the conductor 109 of the IC substrate, the adhesive material 112 is provided. An oscillation body (not shown) in which the oscillators 105 are serially connected joined on the conductive element 111. The oscillation body is divided into the oscillators. Dicing is performed to a surface of the second electrode in dividing, and the transducer elements 102 and the second electrode 104 are cut by using laser.

In the situation mentioned above, an ultrasonic transducer having higher reliability and a method of fabricating the above ultrasonic transducer have been desired.

DETAILED DESCRIPTION

Figure 1:
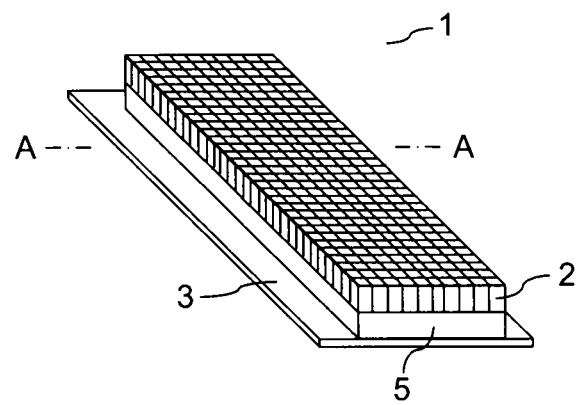
FIG. 1 is a perspective view showing an ultrasonic transducer in a first embodiment.

An aspect of one embodiment, there is provided an ultrasonic transducer including a plurality of oscillators, each of the oscillator having a convex portion, a printed wiring board provided to be opposed to the convex portion, an adhesive material including at least a portion of the convex portion, the adhesive material joining the oscillator and the printed wiring board, and a resin provided between the oscillator and the printed wiring board, the resin covering the convex portion and the adhesive material.

An aspect of another embodiment, there is provided a method of fabricating the ultrasonic transducer mentioned above including providing a plurality of convex portions on a oscillation body, providing the adhesive material with conductivity on a plurality of positions on the printed wiring board, each of the convex portions being provided in each of the positions, joining the convex portion on the oscillation body and the printed wiring board in a state with being aligning each other, providing the resin between the oscillation body and the printed wiring board, and dividing the oscillation body into a plurality of oscillators.

Embodiments on an ultrasonic transducer and a method of fabricating the ultrasonic transducer will be described below in detail with reference to the attached drawings mentioned above. Throughout the attached drawings, similar or same reference numerals show similar, equivalent or same components.

First Embodiment

Figure 2:
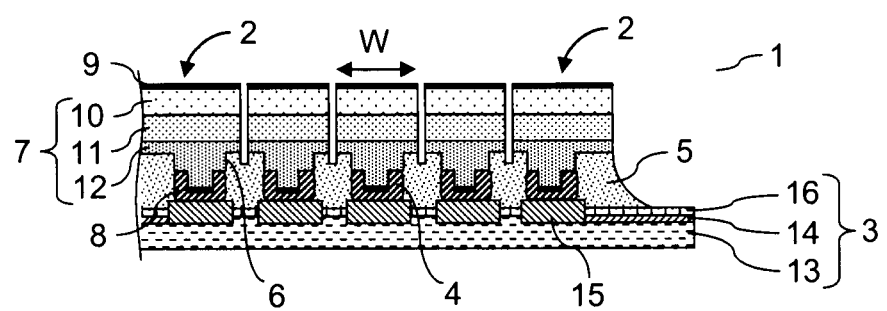
FIG. 2 is a cross-sectional view showing the ultrasonic transducer enlarged along the line A-A of FIG. 1 in the first embodiment.

An ultrasonic transducer 1 in the first embodiment is described using FIG. 1 and FIG. 2 as a reference. As shown in FIG. 1, an ultrasonic transducer 1 includes an adhesive material 4 and a resin 5 between a plurality of oscillators and a printed wiring board 3.

As shown in FIG. 2, each of the oscillators 2 is constituted with a transducer element 7 with a convex portion 6, a first electrode 8 and a second electrode 9. The oscillators 2 are provided as a matrix. In this embodiment, for example, the matrix is arranged with about one hundred in the longitudinal direction and forty in the other direction crossed to the longitudinal direction. On the other hand, a number of the oscillator 2, an arrangement on the oscillators 2 or the like cannot be restricted to the above case. For simplicity, the matrix in FIG. 1 is constituted with about thirty-one in the longitudinal direction and ten in the other direction crossed to the longitudinal direction. FIG. 2 is a cross-sectional view in which the oscillators 2 are partially omitted.

An acoustic matching layer 10, the transducer element 7 includes a piezoelectric element 11 and a backing member in order as a stacked body. The convex portion 6 is constituted with the backing member 12

The acoustic matching layer 10 matches acoustic impedance between the piezoelectric element 11 and an object under test (not shown). First, the piezoelectric element 11 translates an electrical signal into an ultrasonic pulse, and carries the ultrasonic pulse to the object under test. The object under test reflects the ultrasonic pulse to return the acoustic matching layer 10. The acoustic matching layer 10 receives the ultrasonic pulse, and translates into an electrical signal to output.

The backing member 12 absorbs a portion of the ultrasonic pulse which is emitted to the opposite side to the irradiation direction of the ultrasonic pulse when the ultrasonic pulse is carried by the piezoelectric element 11. Accordingly, the backing member 12 can control excess vibration of the piezoelectric element 11.

Each of the convex portions 6 is formed as nearly the same height and has narrower width than the oscillator 2. In this embodiment, the convex portion 6 is formed by the backing member 12. The summit of the convex portion 6 includes nearly a flat surface, and each of four side surfaces of the convex portion 6 includes a step. Further, the summit of the convex portion 6 can be inserted into the adhesive material 4 and has a narrower region than that of the adhesive material 4 to strengthen the connection between the convex portion 6 and the adhesive material 4. On the other hand, the shape of convex portion 6 is not restricted to the above case. The shape of convex portion 6 can be provided as a shape which is be able to insert the summit of the convex portion 6 into adhesive material 4. For example, a shape with a plurality of steps, a columnar shape without steps such as a pillar, a triangle pole, a cylinder, a circular cone, a pyramid or the like can be utilized.

The first electrode 8 in this embodiment is provided on nearly flat plane of the summit of the convex portion in transducer element 7. The second electrode 9 is provided to cover a surface side opposed to the side in which the convex portion 6 is provided. The first electrode 8 is provided on the nearly flat plane of the summit of the convex portion 6 in FIG. 2. On the other hand, the first electrode 8 is not restricted to the above case. The first electrode 8 can be formed on surfaces of the convex portion 6 in the condition of including the summit of the convex portion 6.

Titanium (Ti) and gold (Au) in order are stacked in the first electrode 8 in this embodiment. As another case, nickel (Ni) and Au in order can be stacked in the first electrode 8 in this embodiment. On the other hand, the stacking order, a layer number or materials in the stacked layer are not restricted to the above case. In the second electrode 9, for example, Ti and Au in order are stacked in the second electrode 9 in this embodiment. On the other hand, the stacking order, a layer number or materials in the stacked layer is not restricted to the above case.

The printed wiring board 3 is provided on a surface side opposed to the surface of the first electrode 8 in the oscillator 2. The printed wiring board 3 is connected to a conductor 14 stacked on a printed wiring board 13. Each of the pads 15 is provided at a position corresponding to each of the convex portion 6. A solder resist 16 is provided to surround the pads 15.

Copper (Cu), nickel (Ni) and gold in order, for example, are stacked in the pad 15. On the other hand, the stacking order, a layer number or materials of the stacked layer is not restricted to the above case. An area of the pad 15 is slightly larger than a portion connected to the adhesive material 4.

The adhesive material 4 is provided between the convex portion 6 of the oscillator 2 and the pad 15 of the printed wiring board 3. The adhesive material 4 contacts to cover at least a portion of the convex portion 6, and connects to the oscillator 2 and the printed wiring board 3.

In this embodiment, a metal filler and a thermosetting resin, for example, including a silver (Ag) filler and an epoxy resin, respectively, are utilized as a material for the adhesive material 4. On the other hand, the material for the adhesive material 4 is not restricted to the above case. A material including a solder, both a solder and a thermosetting resin or the like which can electrically connect between the oscillator 2 and the printed wiring board 3 can be utilized.

The resin 5 surrounds the convex portion 6 and the adhesive material 4, and is filled between the oscillator 2 and the wiring substrate 3. A thermosetting resin with 50 ppm or below 50 ppm in thermal expansion coefficient, for example, an epoxy resin is utilized as the material in this embodiment. On the other hand, the material is not restricted to the above case. The same material as the material of resin used as the adhesive material 4 can obtain a reliable connection due to improvement of adhesiveness.

Figure 3A:
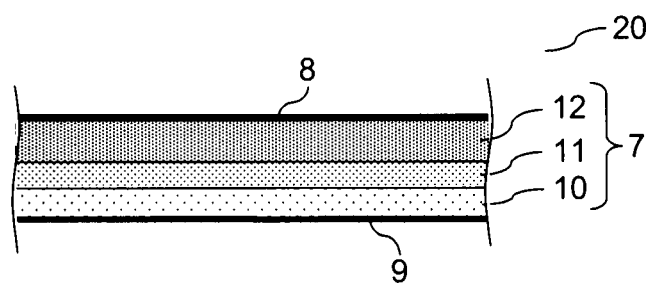
FIGS. 3A-3C are cross-sectional views showing a method of fabricating the ultrasonic transducer in the first embodiment.
Figure 3B:
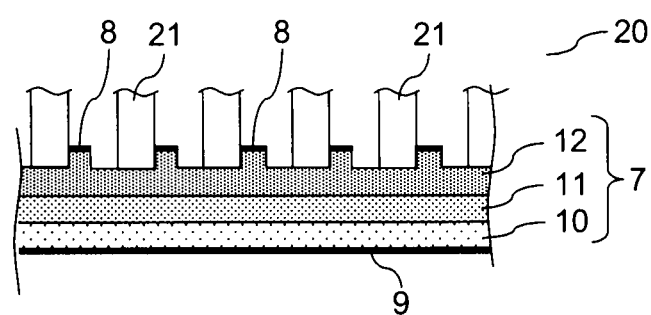

A method of fabricating the ultrasonic transducer 1 is described with reference to FIG. 3, FIG. 4 and FIG. 5.

The method of fabricating the ultrasonic transducer 1 is divided into three processes as a large classification. The first process is providing the convex portion 6 on an oscillation body 20, the second process is providing the adhesive material 4 on the printed wiring board 3, and the third process is connecting between the oscillation body 20 and the printed wiring board 3 and dividing the oscillation body 20. Furthermore, the oscillation body 20 means a state before dividing into the oscillators 2. Therefore, the oscillation body 20 has the same constitution with the oscillator 2.

Processing steps of providing the convex portion 6 on the oscillation body 20 is explained below using FIG. 3 as the reference.

As shown in FIG. 2A, the first electrode 8 and the second electrode 9 are provided on a side of the backing member 12 and a side of the acoustic matching layer 10 in the transducer element 7, respectively.

Ti, Au and Ti are stacked in order as the first electrode 8 in this embodiment. Ti and Au are stacked in order as the second electrode 9. As a method of forming the metals, for example, sputtering, electro-plating or the like can be utilized. The materials and the orders constituted with the first electrode 8 and the second electrode 9 is not restricted to the above case. Those conditions mentioned above can be suitably selected.

As shown in FIG. 2B, a first dicing step is carried out.

The first dicing step is performed to the backing member 12. In the first dicing step, a plurality of blades 21 is utilized. Each of the blades 21 has a thickness of nearly 50 μm and the blades 21 are provided with nearly 200 μm pitch. The thickness and the pitch of each of the blades 21 are not restricted to the above cases. The blade with desirable thickness and pitch can be used. Cutting in the first dicing step in this embodiment is repeated five times with an interval of nearly 25 μm. The interval is set corresponding to a half of the thickness of the blade 21. As a result, a depth and a groove width are nearly 90 μm and 150 μm, respectively. The depth and the width and the shifting distance of the blade 21 and a number of the cutting are not restricted to the above case, further, can be suitably selected.

Figure 3C:
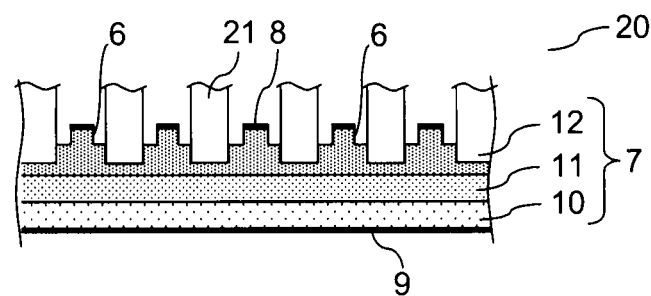

As shown in FIG. 3C, a second dicing step is carried out.

The groove formed in first dicing step is further cut in the second dicing step. The same blade 21 used in the first dicing step is also utilized in the second dicing step. The center portion of the groove is cut to be the depth of nearly 50 μm and the groove width of nearly 50 μm by one dicing step. The same blade 21 used in the first dicing step is used in this embodiment. On the other hand, the blade 21 is not restricted to the above case, but can be used as a different case. Further, the depth and the width of the groove can be changed.

After the processing steps mentioned above, next dicing step is carried out along the perpendicular direction to the diced direction as the same method described in FIGS. 2B and 2C. In such a manner, the convex portion 6 is provided. The convex portion 6 has an area of the summit being $50 \times 50 \ \mu m^2$ and an area of the bottom portion being $150 \times 150 \ \mu m^2$.

In this embodiment, the process is a case in which one step is provided. On the other hand, the process is not restricted to the above case. In a case that a shape with a plurality of steps is desirable, further dicing can be performed to form a step or a plurality of steps. In a case that a shape with a columnar shape without steps such as a pillar, a triangle pole, a cylinder, a circular cone, a pyramid or the like can be utilized, the processing steps can be decreased. In such a manner, as the convex portion is provided by dicing the backing member 12 of the oscillation body 20 with a constant thickness, variations in the height can be suppressed.

Process steps of providing the adhesive material 4 on the printed wiring board 3 is explained below using FIG. 4 as the reference.

Figure 4A:
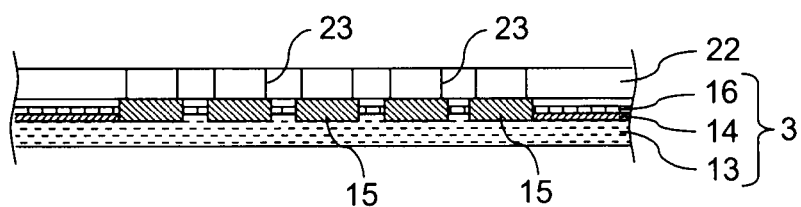
FIGS. 4A-4C are cross-sectional views showing the method of fabricating the ultrasonic transducer in the first embodiment.

As shown in FIG. 4A, a mask 22 is disposed on the wiring substrate 3.

Cu, Ni and Au are stacked in order on the pad 15 in the printed wiring board 3 in this embodiment. The mask 22 includes holes 23 which are aligned with the pad 15 in the printed wiring board 3. An area of each of the holes 23 is slightly smaller than that of the pad 15.

Figure 4B:
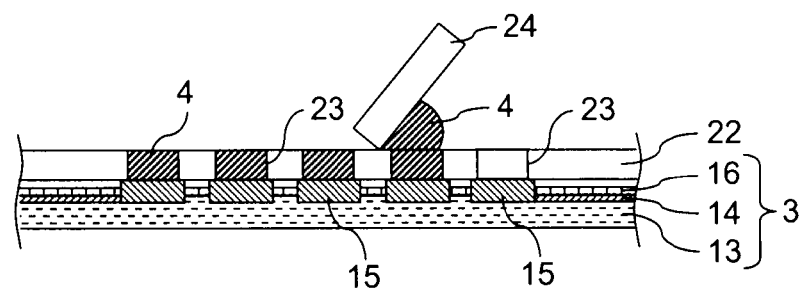

As shown in FIG. 4B, the adhesive material 4 is filled into the hole 23 of the mask 22 by shifting a squeegee 24.

Figure 4C:
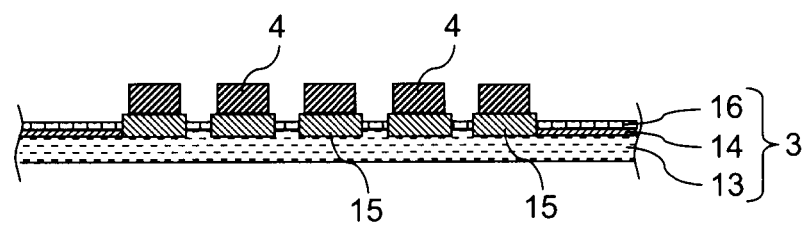

As shown in FIG. 4C, mask 22 is removed. In such a manner, the hole 23 is formed as smaller than the pad 15, and the adhesive material 4 is filled in the hole 23. In joining the printed wiring board 3 and the oscillation body 20 mentioned after, the adhesive material 4 overflows to extend to another pad or the like. As a result, generation of leakage current can be suppressed.

Process steps of joining between the oscillation body 20 and the printed wiring board 3 and dividing the oscillation body 20 into oscillators 2 are explained below using FIG. 5 as the reference.

Figure 5A:
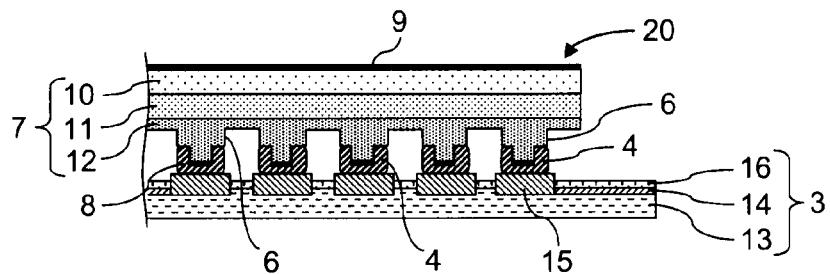
FIGS. 5A-5D are cross-sectional views showing the method of fabricating the ultrasonic transducer in the first embodiment.

As shown in FIG. 5A, the oscillation body 20 is mounted on the printed wiring board 3. In the step, the convex portion 6 of the oscillation body 20 is inserted about 90 μm into the adhesive material 4, so that the convex portion 6 is joined to the adhesive material 4. On the other hand, the joining is not restricted to the above case. A portion of the convex portion 6 can be exposed to be inserted into the adhesive material 4.

In performing such joining, a distance between the printed wiring board 3 and the oscillation body 20 can be extended. Accordingly, dicing into the printed wiring board 3 can be suppressed when the oscillation body 20 is divided into the oscillators 2 mentioned after. As the convex portion 6 is inserted into the adhesive material 4, a contact area can be widened, so that connection with higher strength can be performed. Variations in the height of the convex portions 6 can be substantially less influenced as the insertion, so that electrical connection can be performed.

Figure 5B:
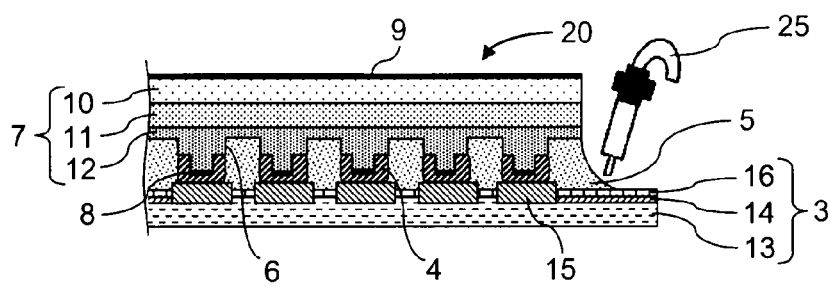

As shown in FIG. 5B, the resin 5 is filled between the oscillation body 20 and the printed wiring board 3. In the processing step, the resin 5 is underfill-coated by using a dispenser 25, so that the resin 5 is filled in a space between the oscillation body 20 and the wiring substrate 3 by capillary.

Figure 5C:
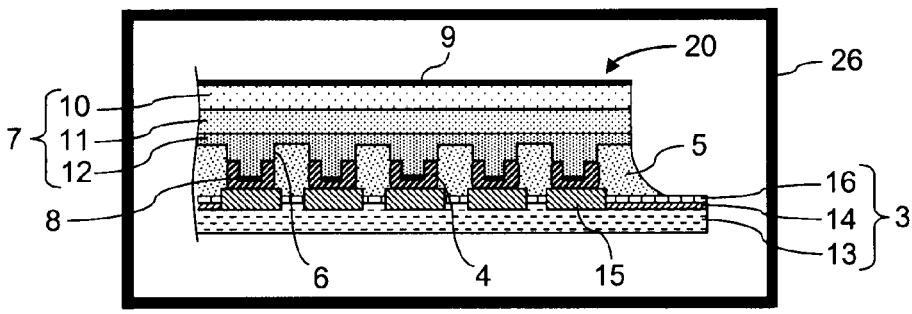

As shown in FIG. 5C, the adhesive material 4 and resin 5 are heated to cure in heating equipment 26, for example. After about ten minutes passes from finishing filling the resin 5 for removing bubbles from the resin 5, the heat treatment is performed at about 150° C. during 4 hours. In the above case, silver filler and epoxy resin are used as the adhesive material 4 in this embodiment. When silver filler and epoxy resin including solder is used as the adhesive material 4, heat treatment is performed at about 240° C. during 30 seconds. Left time after filling the resin 5, heating temperature and time are not restricted to the above cases, and can be suitably selected.

Figure 5D:
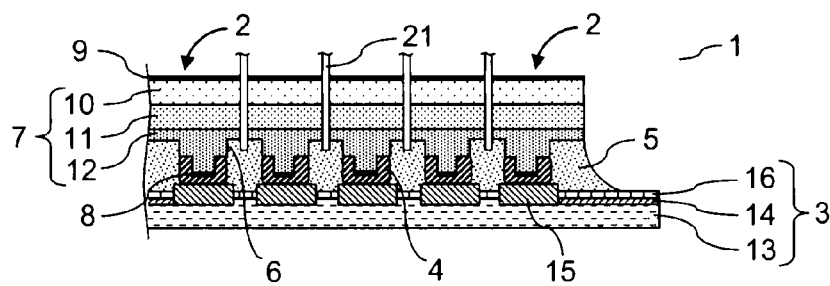

As shown in FIG. 5D, the oscillation body 20 is diced by using the blade 21 with a thickness of about 50 μm. Nearly central portion of adjacent convex portions 6 is set as the dicing position and is diced along a direction to form the oscillators 2 as a matrix. Successively, next dicing is carried out along the perpendicular direction to the diced direction. The resin 5 is also diced slightly to cut the oscillation body 20 accurately.

According to the first embodiment, each of the convex portions 6 is provided in a prescribed interval fashion on the backing member 12, and a portion of the convex portion 6 is inserted into the adhesive material 4 on the printed wiring board 3 to join the convex portions 6 with the adhesive material 4.

In such a manner, as the convex portion 6 is composed of the backing member 12, the height of the convex portion 6 can be nearly uniformed by forming the convex portion 6 in the backing member 12. Furthermore, as the portion of the convex portion 6 is included with the adhesive material 4 in the mounting process, the distance between the printed wiring board 3 and the oscillation body 20 can be extended, and dicing into the printed wiring board 3 can be suppressed. Consequently, highly reliable transducer can be obtained. Further, the contact area is widened due to inserting the convex portion 6 into the adhesive material 4 in connection, so that high strength connection with retaining electrical connection can be performed in the dicing process. Therefore, further highly reliable transducer can be obtained.

In the embodiment mentioned above, the dicing step is carried out after the first electrode 8 and the second electrode 9 are provided. On the other hand, the second electrode 9 is provided in first, and the first electrode 8 can be provided after the convex portion 6 is provided.

Second Embodiment

An ultrasonic transducer in the second embodiment is described below in detail with reference to the attached drawings FIGS. 6, 7 and 8 mentioned above. It is different from the first embodiment that each of convex portions 32 is provided on each of oscillators 31. On the other hand, another component in the second embodiment other than the different point is the same as that in the first embodiment. Accordingly, an ultrasonic transducer 30 including the convex portion 32 which is different from the first embodiment and a method of fabricating the ultrasonic transducer 30 are demonstrated in FIGS. 6, 7 and 8 in this embodiment.

Figure 6:
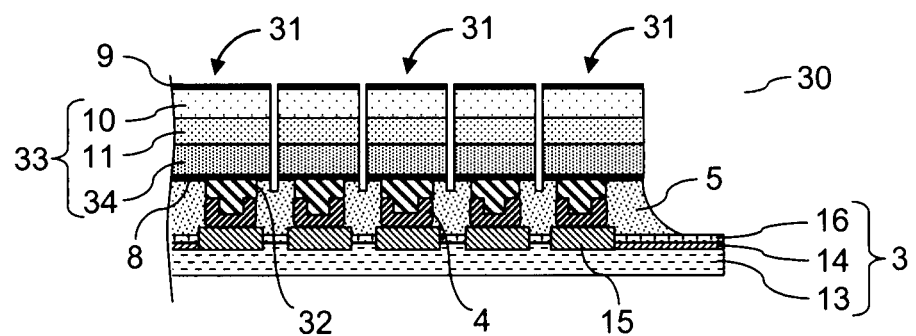
FIG. 6 is a cross-sectional view showing an ultrasonic transducer in a second embodiment.

As shown in FIG. 6, the convex portion 32 in the ultrasonic transducer 30 is provided on the oscillator 31 in this embodiment. The oscillator 31 is constituted with a transducer element 33, a first electrode 8 and a second electrode 9.

The transducer element 33 includes an acoustic matching layer 10, a piezoelectric element 11 and a backing member 34 in order as a stacked body. The first electrode 8 and the second electrode 9 are provided on both surfaces of the transducer element 33 corresponding to each other in the longitudinal direction of the transducer element 33.

A plurality of the convex portions 32 are provided on the first electrode 8, and each of the convex portions 32 is set in a prescribed interval. The convex portion 32 is composed of a conductive bump including gold (Au), solder or the like, for example.

The method of fabricating the ultrasonic transducer is described below with reference to FIG. 7 and FIG. 8.

The method of fabricating the ultrasonic transducer 30 is divided into three processes as a large classification. The first process is providing the convex portion 32 on an oscillation body 35, the second process is providing the adhesive material 4 on the printed wiring board 3, and the third process is joining between the oscillation body 35 and the printed wiring board 3 and dividing the oscillation body 35. Furthermore, the oscillation body 35 means a state before dividing into the oscillator 31. Therefore, the oscillation body 35 has the same constitution as the oscillator 31. The process of providing the adhesive material 4 on the wiring substrate 3 is the same as the first embodiment, so that the explanation is omitted.

Process steps of providing the convex portion 32 on the oscillation body 35 is explained below using FIG. 3 as the reference.

Figure 7A:
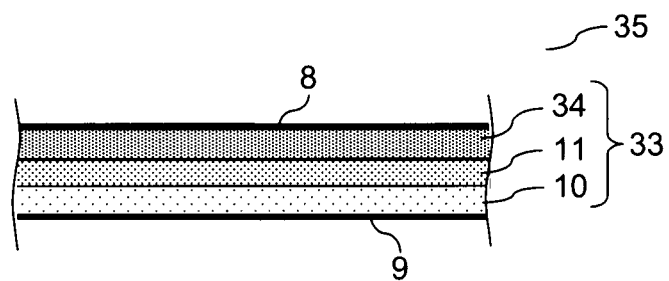
FIGS. 7A-7B are cross-sectional views showing a method of fabricating the ultrasonic transducer in the second embodiment.

As shown in FIG. 7A, the first electrode 8 and the second electrode 9 are provided on a side of the backing member 34 and a side of the acoustic matching layer 10 in the transducer element 33, respectively.

Ti, Au and Ti are stacked in order in the first electrode 8, and Ti and Au are stacked in order in the second electrode 9. As a method of forming the metals, for example, sputtering, electro-plating or the like can be utilized.

Figure 7B:
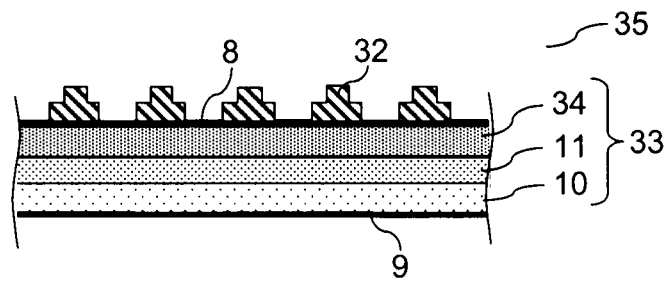

As shown in FIG. 7B, a bump material is provided on the first electrode 8. The bump material is provided by using wire-bonding. An amount of the bump material to form the convex portion 32 is provided.

Process steps of joining between the oscillation body 35 and the wiring substrate 3 and dividing the oscillation body 35 into oscillators 31 are explained below using FIG. 8 as the reference.

Figure 8A:
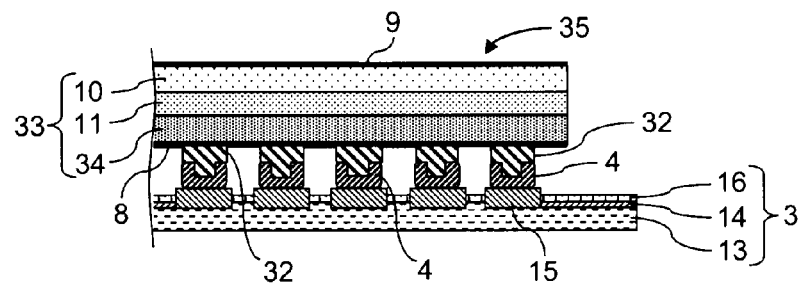
FIGS. 8A-8d are cross-sectional views showing the method of fabricating the ultrasonic transducer in the second embodiment.

As shown in FIG. 8A, the oscillation body 35 is mounted on the printed wiring board 3. In the step, at least a portion of the convex portion 32 of the oscillation body 35 is exposed to be inserted into the adhesive material 4 on the printed wiring board 3, so that the convex portion is joined to the adhesive material 4.

In performing such joining, a distance between the printed wiring board 3 and the oscillation body 35 can be extended. Accordingly, dicing into the printed wiring board 3 can be suppressed when the oscillation body 35 is divided into the oscillators 31 mentioned after. As the convex portion 6 is inserted into the adhesive material 4, a contact area can be widened so that connection with higher strength can be performed. Variations in the height of the convex portions 6 can be substantially less influenced as the insertion, so that electrical connection can be performed.

Figure 8B:
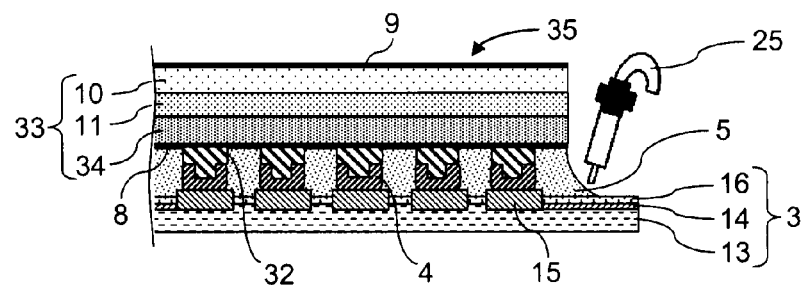

As shown in FIG. 8B, a resin 5 is filled between the oscillation body 35 and the printed wiring board 3. In the steps, the resin 5 is underfill-coated by using a dispenser 25, so that the resin 5 is filled in a space between the oscillation body 35 and the printed wiring board 3 by capillary.

Figure 8C:
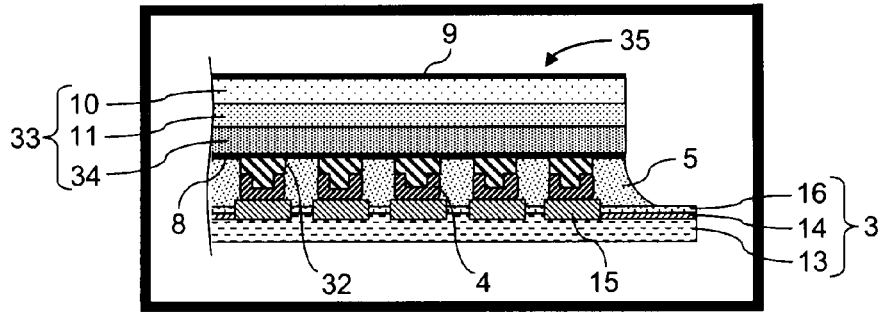

As shown in FIG. 8C, the adhesive material 4 and the resin 5 are heated to cure in heating equipment 26 for example. After about ten minutes passes from finishing filling the resin 5 for removing bubbles in the resin, the heat treatment is performed at about 150° C. during 4 hours. In the above case, silver filler and epoxy resin are used as the adhesive material 4 in this embodiment. When silver filler and epoxy resin including solder is used as the adhesive material 4, heat treatment is performed at about 240° C. during 30 seconds. Left time after filling the resin 5, heating temperature and time are not restricted to the above cases, and can be suitably selected.

Figure 8D:
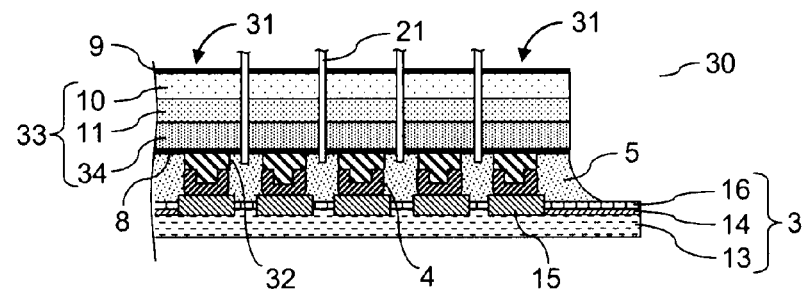
Figure 9:
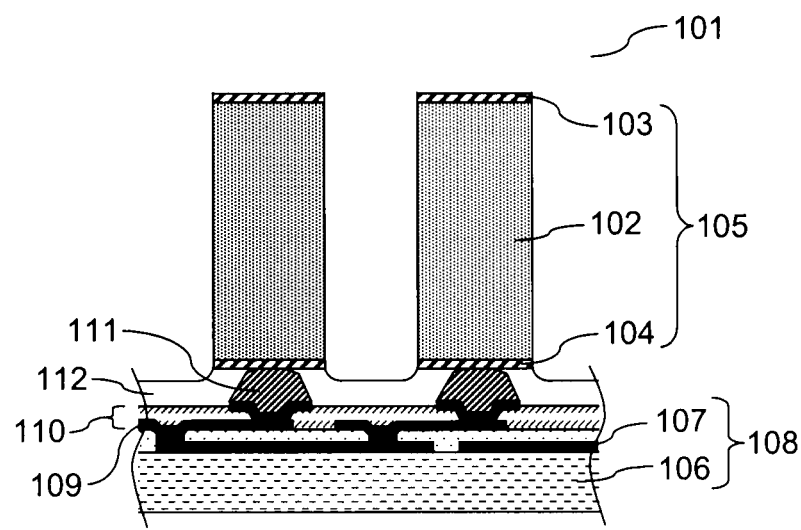
FIG. 9 is a cross-sectional view showing an ultrasonic transducer in conventional technology.

As shown in FIG. 8D, the oscillation body 35 is diced by using a blade 21 with a thickness of about 50 μm. Nearly central portion of adjacent convex portions 6 is set as the dicing position. Successively, next dicing is carried out along the perpendicular direction to the diced direction. The resin 5 is also diced slightly to cut the oscillation body 35 accurately.

According to the second embodiment, each of the convex portions 32 is provided in a prescribed interval fashion on the oscillator 31, and a portion of the convex portion 32 is inserted into the adhesive material 4 on the printed wiring board 3 to join the convex portions 6 with the adhesive material 4.

In such a manner, at least a portion of the convex portion 6 is inserted to be included in the adhesive material 4, so that the convex portion can be mounted. Consequently, the distance between the printed wiring board 3 and the oscillation body 20 can be extended, and dicing into the printed wiring board 3 can be suppressed. Further, variations in the height of the convex portions 6 can be substantially less influenced as the insertion, so that electrical connection can be performed. Consequently, highly reliable transducer can be obtained. Further, the contact area is widened due to inserting the convex portion 6 into the adhesive material 4 in connection, so that higher strength connection with retaining electrical connection can be performed in the dicing process. Therefore, further highly reliable transducer can be obtained.

Other embodiments of the present disclosure will be apparent to those skilled in the art from consideration of the specification and practice of the disclosure disclosed herein. It is intended that the specification and example embodiments be considered as exemplary only, with a true scope and spirit of the disclosure being indicated by the claims that follow. The disclosure can be carried out by being variously modified within a range not deviated from the gist of the disclosure.

What is claimed is:

1. An ultrasonic transducer, comprising:
a plurality of oscillators, each of the oscillators having a convex portion;
a printed wiring board provided to be opposed to the convex portion;
an adhesive material including at least a portion of the convex portion, the adhesive material joining each of the oscillators and the printed wiring board; and
a resin provided between the oscillator and the printed wiring board, the resin covering the convex portion and the adhesive material.

2. The ultrasonic transducer of claim 1, wherein
the oscillator is constituted with a transducer element including an acoustic matching layer, a piezoelectric element and a backing member in order as a stacked body, a first electrode on the backing member and a second electrode on the acoustic matching layer, and the convex portion is constituted with the first electrode and the backing member.

3. The ultrasonic transducer of claim 2, wherein
the oscillator is constituted with the transducer element including the acoustic matching layer, the piezoelectric element and the backing member in order as the stacked body, the first electrode on the backing member and the second electrode on the acoustic matching layer, and the convex portion is provided on the first electrode.

4. A method of fabricating the ultrasonic transducer according to claim 1, comprising:
providing a plurality of convex portions on a oscillation body;
providing the adhesive material with conductivity on a plurality of positions on the printed wiring board, each of the convex portions being provided in each of the positions;
joining each of the convex portions on the oscillation body and the printed wiring board in a state with being aligning each other;
providing the resin between the oscillation body and the printed wiring board; and
dividing the oscillation body into a plurality of oscillators.

5. The method of claim 4, wherein
at least a portion of each of the convex portions is included by the adhesive material in joining each of the convex portions on the oscillation body and the printed wiring board in the state with being aligning each other.

6. The method of claim 4, wherein
a portion of the resin provided between the oscillation body and the printed wiring board is diced in dividing the oscillation body into the plurality of oscillators.

7. The method of claim 4, wherein
the oscillation body is constituted with an acoustic matching layer, a piezoelectric element and a backing member in order as a stacked body, and a first electrode is provided on the backing member and a second electrode is provided on the acoustic matching layer, and the backing member is diced in providing the convex portion.

8. The method of claim 4, wherein
the oscillation body is constituted with an acoustic matching layer, a piezoelectric element and a backing member in order as a stacked body, and a first electrode is provided on the backing member and a second electrode is provided on the acoustic matching layer, and a conductive bump is formed on the first electrode in providing the convex portion.

* * * * *